United States Patent [19]

Kitagawa et al.

[11] Patent Number: 5,426,589
[45] Date of Patent: Jun. 20, 1995

[54] METHOD OF AND APPARATUS FOR LIMITING ELECTRICAL LOADS ON AN ELECTRIC VEHICLE

[75] Inventors: Masashi Kitagawa; Kenichiro Kimura, both of Wako, Japan

[73] Assignee: Honda Giken Kogyo Kabushiki Kaisha, Tokyo, Japan

[21] Appl. No.: 945,744

[22] Filed: Sep. 16, 1992

[30] Foreign Application Priority Data

Sep. 17, 1991 [JP]  Japan .................. 3-236536

[51] Int. Cl.⁶ ............................. G08B 21/00; H02J 7/04
[52] U.S. Cl. ...................................... 364/480; 364/483;
364/492; 364/431.01; 320/29; 320/30; 320/49;
324/143
[58] Field of Search .............. 364/480, 482, 483 492,
364/431.01; 324/142, 143; 320/6, 39, 48, 29, 30,
49

[56] References Cited

U.S. PATENT DOCUMENTS

| | | | |
|---|---|---|---|
| 4,903,208 | 2/1990 | Murai et al. | 364/483 |
| 4,904,945 | 2/1990 | Kouan et al. | 364/483 |
| 4,964,065 | 10/1990 | Hicks et al. | 364/483 |
| 4,989,155 | 1/1991 | Begin et al. | 364/483 |
| 5,047,961 | 9/1991 | Simonsen | 364/483 |
| 5,063,516 | 11/1991 | Jamoua et al. | 364/483 |
| 5,151,865 | 9/1992 | Blessing et al. | 364/483 |
| 5,160,926 | 11/1992 | Schweitzer, III | 364/483 |
| 5,229,713 | 7/1993 | Bullock et al. | 364/483 |

FOREIGN PATENT DOCUMENTS

| | | |
|---|---|---|
| 56-30524 | 7/1981 | Japan . |
| 57-53702 | 11/1982 | Japan . |
| 62-241733 | 10/1987 | Japan . |
| 63-61360 | 4/1988 | Japan . |
| 63-77302 | 8/1988 | Japan . |
| 63-255152 | 10/1988 | Japan . |
| 63-284052 | 11/1988 | Japan . |

Primary Examiner—Emanuel T. Voeltz
Assistant Examiner—Alan Tran
Attorney, Agent, or Firm—Lyon & Lyon

[57] ABSTRACT

Disclosed herein is a method of and an apparatus for limiting electrical loads due to electrical equipment on an electric vehicle. In the electrical load limiting apparatus, a desired running distance is inputted by a desired running distance inputting device and a depth of discharge of a battery is detected by a battery condition detecting device. Ambient environment data for the electric vehicle are obtained from an illuminance sensor, a temperature sensor and a raindrop sensor. An arithmetic device is activated to determine and compute running conditions on the basis of the desired running distance, the depth of discharge and the ambient environment data. The electrical loads are controlled by an electrical load limiting device based on the result of the determination by the arithmetic device. Since the electrical loads are limited based on the running conditions, an accurate judgment can be made, based on the ambient environment, as to whether or not the electric vehicle can cover the inputted desired running distance.

15 Claims, 10 Drawing Sheets

| LOAD RESTRICTION LEVELS | CONTENTS OF LOAD RESTRICTION |
|---|---|
| P₁ | D② |
| P₂ | D①② |
| P₃ | C + D①② |
| P₄ | B + C + D①② (B:LOW) |
| P₅ | B + C + D①② (B:INTERMITTENT) |
| P₆ | B + C + D①② (B:STOP) |

↓ INCREASE IN AMOUNT OF LOAD RESTRICTION

TABLE FOR LOAD RESTRICTION LEVELS

METHOD OF AND APPARATUS FOR LIMITING ELECTRICAL LOADS ON AN ELECTRIC VEHICLE

BACKGROUND OF THE INVENTION

1. Field of the Invention:

The present invention relates to a method of and an apparatus for limiting electrical loads due to electrical equipment mounted on an electric vehicle, and more particularly to a method of and an apparatus for enabling electrical loads due to electrical equipment mounted on an electric vehicle to be restricted based on a relationship between a desired attainable travel distance and the depth of discharge of a battery.

2. Description of the Related Art:

A large battery, which has heretofore been developed, should be mounted on an electric vehicle in order to increase a running range or distance. Therefore, the weight of the battery increases.

It is however desirable that the battery is reduced in weight in the electric vehicle which is to cover a desired distance with less electrical energy. Under the existing circumstances, the capacity of the battery is inevitably limited. There is therefore a demand for a technique of automatically limiting electrical loads imposed by electrical equipment or components mounted on the vehicle in order to maximize the running distance at one charge level.

In the latest vehicle, the kind and number of electrical equipment increases and hence loads connected to a battery become greater. Therefore, various techniques for limiting the loads have been developed. Conventional examples, which will be described below, are not related to the electric vehicle, but the following disclosure will be described as examples. A technique for reducing current flowing through a fan motor when the voltage of a battery is reduced, has been disclosed in Japanese Utility Model Application Laid-Open Publication No. 56-30524. Another technique for melting a fuse to electrically disconnect an electrical load from a battery when the voltage of the battery is reduced to a prescribed level or below, has been disclosed in Japanese Utility Model Application Laid-Open Publication No. 57-53702. A further technique for cutting off or disconnecting an electrical load from a battery when the battery is in an over-discharged state, has been disclosed in Japanese Patent Application Laid-Open Publication No. 62-241733. A still further technique for cutting off the supply of electric power to some of the electrical loads when the voltage of a battery is reduced, has been disclosed in Japanese Patent Application Laid-Open Publication No. 63-255152. A still further technique for cutting off the supply of electric power to an electrical load when the voltage of a battery is reduced to a given value or below and producing a warning, has been disclosed in Japanese Patent Application Laid-Open Publication No. 63-284052. A still further technique for varying a supply voltage depending on the state of operation of an engine has been disclosed in Japanese Utility Model Application Laid-Open Publication No. 63-61360. A still further technique for reducing the torque output of the motor as a result of a detected malfunction in the battery system, such as for a zinc-bromine battery that requires fluid circulation by a pump and precise temperature control, has been disclosed in Japanese Patent Application Laid-Open Publication No. 63-77302.

In all the techniques referred to above, however, the electrical loads are limited only under a certain restriction mode. Therefore, the running distance may or may not increase to a driver's desired arrival point even if such techniques are applied to the electric vehicle. There is also a situation in which the electrical loads are occasionally limited beyond need. Owing to such a restriction, functions inherent to the electric vehicle cannot be achieved and the running condition desired by the driver cannot be obtained.

SUMMARY OF THE INVENTION

It is a principal object of the present invention to provide a method of and an apparatus for limiting electrical loads on an electric vehicle, wherein the minimum and most suitable amount of load restriction is automatically computed according to vehicle use environment to cover a desired running distance inputted by a driver and the restriction of the electrical loads is executed based on the result thus computed.

It is another object of the present invention to provide a method of limiting electrical loads on an electric vehicle, comprising steps of: inputting a desired running distance by desired running distance inputting means, detecting a depth of discharge of a battery by battery condition detecting means, obtaining ambient environment data, determining and computing running conditions by an arithmetic device using the desired running distance, the depth of discharge and the ambient environment data, and controlling each of electrical loads on running means by electrical load limiting means based on the result of the determination by the arithmetic device.

It is a further object of the present invention to provide a method wherein the electrical load control is carried out according to the depth of discharge when the electric vehicle runs without imputting the desired running distance by the desired running distance inputting means at the time of commencement of running of the electric vehicle.

It is a still further object of the present invention to provide a method wherein the electrical load control is stepwise performed in accordance with the depth of discharge.

It is a still further object of the present invention to provide a method wherein the electrical load control is carried out in such a manner that charging instructions are issued when the desired running distance cannot be attained even if the electrical load is stepwise controlled in accordance with the depth of discharge.

It is a still further object of the present invention to provide a method wherein the electrical load control is performed in such a manner that instructions for correcting the desired running distance are issued when the desired running distance cannot be attained even in the case where the battery has been fully charged and the electrical load is stepwise controlled in accordance with the depth of discharge.

It is a still further object of the present invention to provide a method wherein the electrical load control is performed in such a manner that suitable instructions are given to a driver depending on the state of control of the electrical load.

It is a still further object of the present invention to provide a method wherein the ambient environment data on the electric vehicle are data output from an illuminance sensor, a temperature sensor and a raindrop sensor.

It is a still further object of the present invention to provide a method wherein the determination and computation of the running conditions are performed based on vehicle run data of the past.

It is a still further object of the present invention to provide a method wherein the determination and computation of the running conditions are performed using a map for predicting the consumption of energy.

It is a still further object of the present invention to provide a method wherein the map is produced in such a manner that a vehicle drivable distance is divided into a plurality of zones and the determination and computation of the running conditions are carried out using the map.

It is a still further object of the present invention to provide a method wherein the plurality of zones in the map are represented in the form of the following zones:

A: a zone to which it is possible to reach without restricting electrical loads connected to the battery;

B: a zone to which it is possible to reach by restricting electrical loads connected to the battery;

C: a zone to which it is impossible to reach unless the battery is charged; and

D: a zone to which it is impossible to reach even if the battery is fully charged.

It is a still further object of the present invention to provide a method wherein the representation of the plurality of zones in the form of the four zones is made on the basis of the depth of discharge regarded as 80%.

It is a still further object of the present invention to provide an apparatus for limiting electrical loads due to electrical equipment mounted on an electric vehicle, comprising running means, a battery for driving the running means, battery condition detecting means for detecting a depth of discharge of the battery, desired running distance inputting means for inputting a desired running distance, computing means supplied with the depth of discharge detected by the battery condition detecting means, the desired running distance inputted by the desired running distance inputting means and ambient environment data on the electric vehicle to thereby determine and compute running conditions, and electrical load controlling means for controlling the electrical loads on the electric vehicle based on the result of determination by the computing means.

It is a still further object of the present invention to provide an apparatus wherein the computing means comprises depth-of-discharge arithmetic means for computing and determining the remaining capacity of the battery and arithmetic means for determining desired running conditions from the desired running distance inputted by the desired running distance inputting means.

It is a still further object of the present invention to provide an apparatus wherein the computing means includes a map for predicting the consumption of energy, the map being divided into the following four zones:

A: a zone to which it is possible to reach without limiting electrical loads connected to the battery;

B: a zone to which it is possible to reach by limiting electrical loads connected to the battery;

C: a zone to which it is impossible to reach unless the battery is charged; and

D: a zone to which it is impossible to reach even if the battery is fully charged.

The above and other objects, features and advantages of the present invention will become apparent from the following description and the appended claims, taken in conjunction with the accompanying drawings in which a preferred embodiment of the present invention is shown by way of illustrative example.

DETAILED DESCRIPTION OF THE PREFERRED EMBODIMENTS

A method of and an apparatus for limiting or restricting electrical loads on an electric vehicle, according to the present invention will hereinafter be described with reference to the accompanying drawings in which a preferred embodiment is shown by way of illustrative example.

Figure 1:
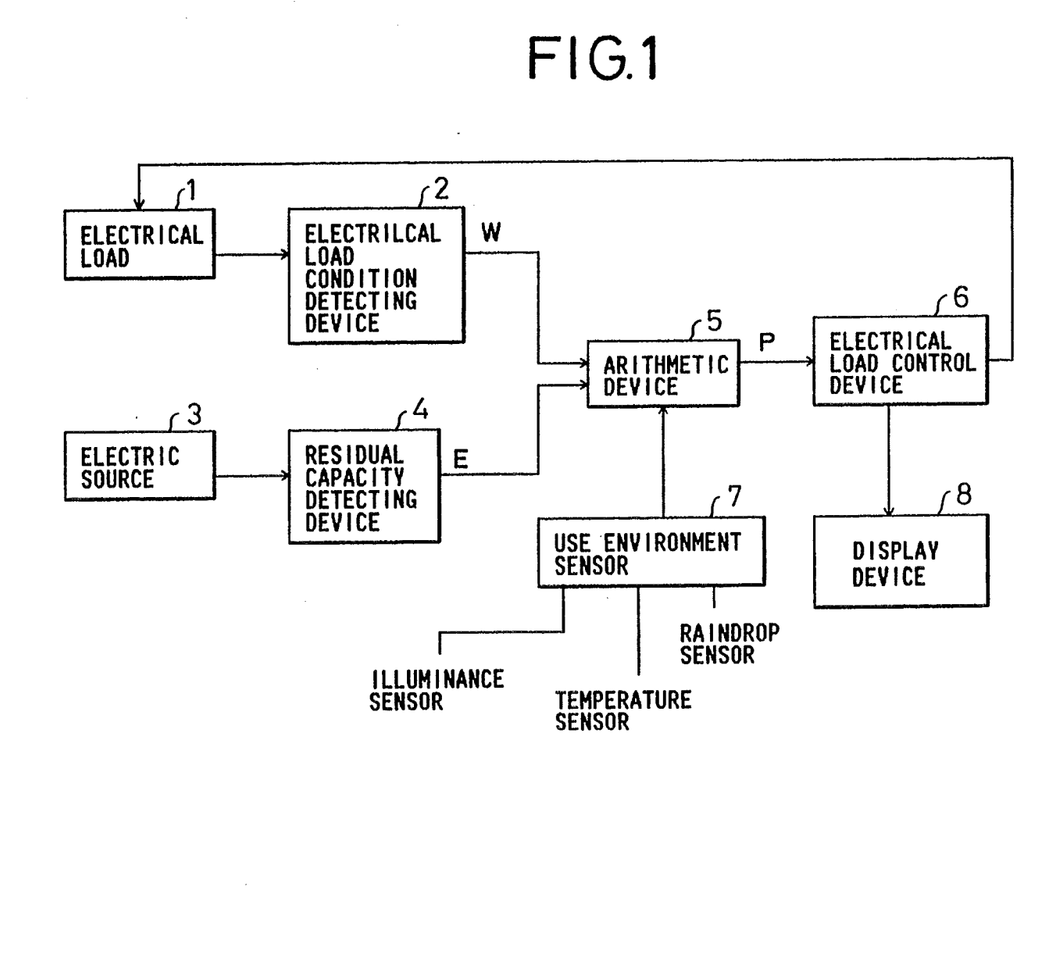
FIG. 1 is a block diagram showing an apparatus for limiting electrical loads on an electric vehicle, according to one embodiment of the present invention.

As shown in FIG. 1, the electrical load limiting apparatus according to the present embodiment basically comprises an electrical load 1, an electrical load condition detecting device 2, an electric source 3, a residual capacity detecting device 4, an arithmetic device 5, an electrical load control device 6, a use environment sensor 7 and a display device 8. The electrical load condition detecting device 2 detects the state or condition of each of various electrical equipment or components serving as electrical loads on an electric vehicle so as to produce a detected signal W and supplies it to the arithmetic device 5. The residual capacity detecting device 4 detects the residual capacity of the electric source 3 such as a battery so as to produce a detected signal E and supplies it to the arithmetic device 5. Further, the arithmetic device 5 is also supplied with detected signals (e.g., sensor outputs such as vehicle ambient brightness, temperature, moisture, wind velocity and weather indicative of vehicle use environments or conditions) output from various sensors provided depending on the use environments of the electric vehicle.

The arithmetic device 5 electrically processes the detected signal W received from the load condition detecting device 2 so as to supply a control signal P to the electrical load control device 6 where the electrical load 1 is controlled. In addition, the display device 8 displays the state of drive restriction of the electrical load 1 in response to the control signal P received by the electrical load control device 6 in order to inform a driver or the like of the state of its drive restriction.

In the electric vehicle, the priority of the various electrical equipment each serving as the electrical load 1 as to the drive restriction of the electrical equipment is determined in advance in order of importance of the electrical equipment mounted on the electrical vehicle.

The electrical equipment is divided into four groups of A, B, C and D, for example. The A group is a group of electrical equipment that cannot be applied as objects subjected to the load restriction in view of safety and law or the like. The B group is a group of electrical equipment that can be applied as objects subjected to the load restriction and for which the amount of restriction of each electrical load, i.e., the load restriction amount, can be adjusted. The C group is a group which is controlled in accordance with the use environments (such as weather, day and night, etc.) of the electric vehicle as well as with the residual capacity of the electric source 3 and the state of each electrical load so as to avoid the use of a corresponding electrical load when unnecessary. For example, a process for automatically putting out the lights that a driver forgot to turn off after passage through a tunnel and an intermittent operation of a wiper, which is performed during a period in which the vehicle is being stopped while the driver is waiting for a traffic signal, are included as objects. The D group is a group of electrical equipment that can be applied as objects subjected to the load restriction and for which the load restriction amount cannot be adjusted. The D group is divided into two large groups (1) and (2). Electrical equipment or component which belong to group (1) have load limiting or restricting conditions softer than the electrical equipment which belong to group (2). In other words, the electrical equipment, which belong to group (2), are subject to restrictions prior to the electrical equipment belonging to the group (1) or under softer conditions.

The electrical equipment which belongs to the respective groups, will be illustrated below.

A Group (unable to be placed under restrictions)

Hazard light, power brake, stop light, turn light, position light, motor controller, back light, regenerative energy system, license light, horn, meter and the like, window washer, radio and clock B Group (performance restriction)

Blower motor, heater coil, condenser fan and air conditioner

C Group (load saving)

Headlight, tail light, license light, fog light, wiper and rear defroster

D Group (able to be placed under adjustable restrictions)

(1) Interior light, remocon (remote control) mirror, auto antenna, power door lock (2) Map light, heated mirror, courtesy light, trunk light, power sheet, key light, sunroof, glove box light, cigar lighter.

Figure 8:
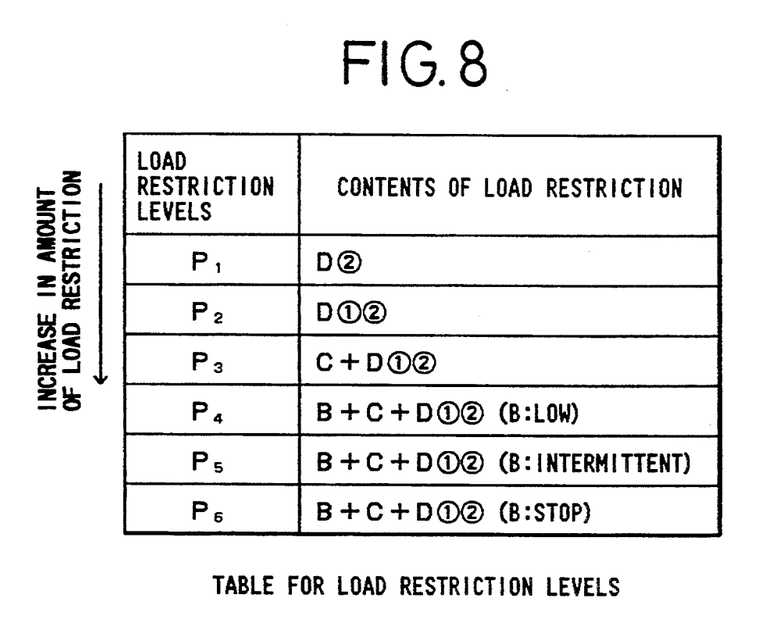
FIG. 8 is a table for describing electrical-load restriction levels of the electrical load limiting apparatus shown in FIG. 1.

A table of these respective groups of electrical components and the ascending levels of load restrictions $P_1$ through $P_6$ that may be employed, as described later, are shown in FIG. 8.

A brief description will now be made of the difference in operation between an automatic vehicle (hereinafter called an "AT vehicle") with a conventional engine mounted thereon and an electric vehicle (hereinafter called an "E vehicle").

The AT vehicle will first be described. A driver sets a shift lever to a parking position and turns an ignition key (engine key) ON to start the engine Then, the driver operates the shift lever while pressing a brake pedal and depresses an accelerator pedal to start driving. When a vehicle provided with a shift lever lock key is driven, the shift lever lock key may be released from locking immediately after a desired time interval from the arrival of the driver in the vehicle to the operation of the shift lever has elapsed.

The E vehicle will next be described. The driver shifts a shift lever to a parking position after the shift lever has been released from locking, and turns the engine key (ignition switch) ON. Then, the driver depresses the accelerator pedal to start driving after the driver has operated the shift lever while depressing the brake pedal. Thus, the difference in operation between the AT vehicle and the E vehicle is not substantial. In the AT vehicle, however, power is transmitted to the vehicle when the engine has been brought to an ON state and the shift lever has been operated. In the E vehicle on the contrary, electric power is not supplied to an electric motor for driving the vehicle unless the driver depresses the accelerator pedal even if the shift lever is operated. Accordingly, the electric motor is de-energized unless the accelerator pedal is depressed in the E vehicle.

Figure 2:
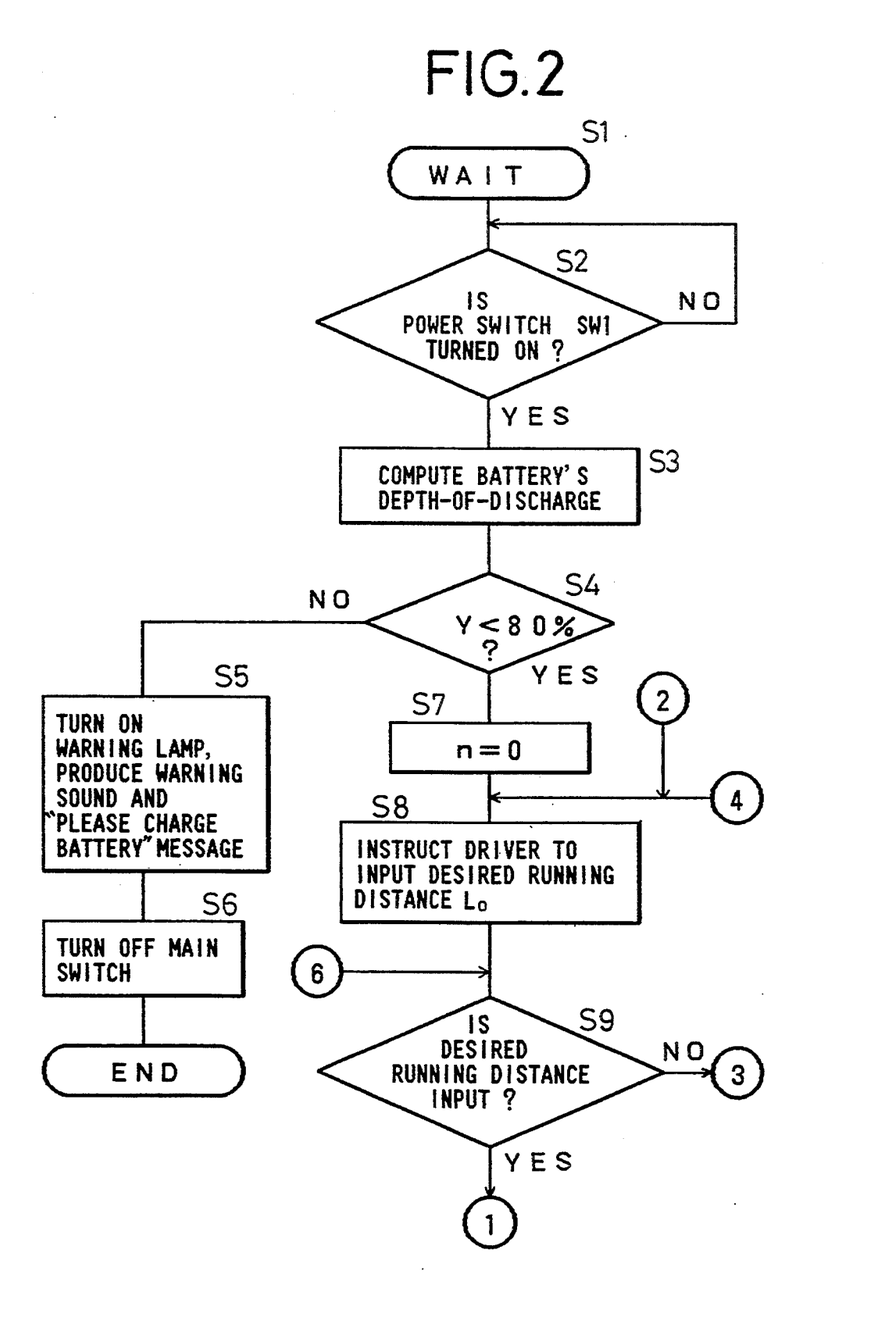
FIG. 2 is a flowchart for controlling the electrical load limiting apparatus shown in FIG. 1.

The state of operation of the above embodiment will now be described with reference to flowcharts shown in FIGS. 2 through 4.

In Step S1, the E vehicle stops moving and is in a running standby state. At this time, the electric power is supplied to a storage unit for storing therein data required to drive the E vehicle when a power switch SW1 is in an OFF state. At this time, the shift lever for changing the vehicle transmission position cannot be shifted to another position. That is, the shift lever lock key is in a locked state.

When the power switch SW1 is turned ON in Step S2, the electric power is supplied to a vehicle control circuit, but the other conditions are the same as when a conventional vehicle ignition key is in an ON state.

When the power switch SW1 is turned ON, computation is made in Step S3 as to a battery depth-of-discharge Y representing to what degree the battery has been discharged from the time that the battery has been fully charged. The depth of discharge Y is repeatedly computed at regular time intervals during a period in which the power switch SW1 is turned ON.

It is determined in Step S4 whether or not the depth of discharge Y of the battery is less than 80%. If the answer is determined to be No, then a warning sound is produced and a warning lamp is turned on in Step S5. In addition, a message indicative of "Please charge the battery" is displayed. Then, the power switch SW1 is turned OFF (Step S6) and the routine procedure remains unchanged unless the battery is charged.

If the depth of discharge Y is less than 80% and the residual capacity of the battery is large, then the flag n is set to 0 in Step S7. In this case, "n=0" indicates that the E vehicle is in a state prior to the start of its running, i.e., a non-driven state.

Then, instructions for inputting an expected or desired running distance (Lo) that the driver desires to run from now, are made in Step S8. For example, a speech synthesizer is used to instruct the driver to execute "Please input the desired running distance".

When the desired running distance (Lo) is inputted, it is determined in Step S9 whether or not Lo has been inputted. Then, the routine procedure proceeds to Steps S10 and S11 (to be described later), which basically determine whether the E vehicle has transmitted the desired distance Lo, followed by proceeding to Step S12 to select one of running conditions in a running condition determining and computing subroutine. If the desired running distance (Lo) has not been imputted, the routine proceeds to the subroutine illustrated in FIG. 9 (through Figure connecting symbol 3) to Step S48 which will be described later.

Figure 5:
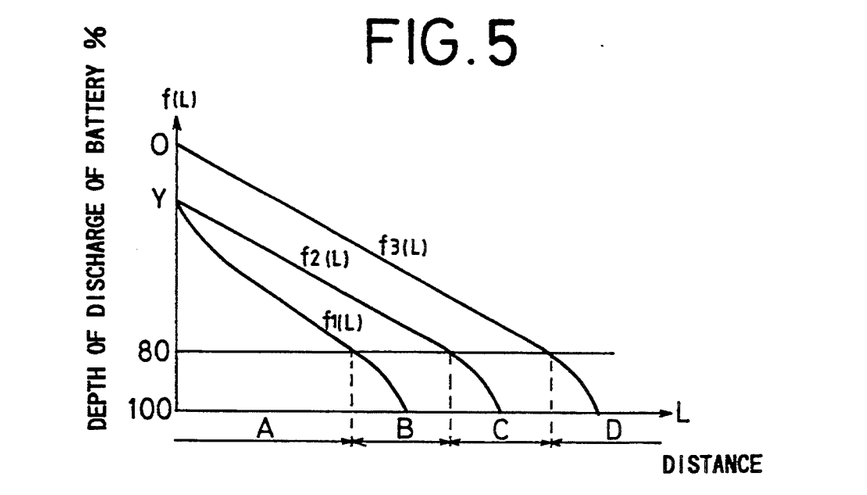
FIG. 5 is an energy consumption precognitive map of the electrical load limiting apparatus illustrated in FIG. 1.

In the running condition determining and computing subroutine of Step S12, a process for determining to which zone of the following four zones the running condition corresponds is made from a map shown in FIG. 5 for predicting or precognizing the consumption of energy on the basis of the inputted desired running distance.

A: a zone to which it is possible to reach without restricting electrical loads connected to the battery B: a zone to which it is possible to reach by restricting electrical loads connected to the battery C: a zone to which it is impossible to reach unless the battery is charged D: a zone to which it is impossible to reach even if the battery is fully charged.

This determination is made by selecting a corresponding zone from the A, B, C and D zones under the condition that electrical equipment to be used are predicted or precognized by using a luminance or illuminance sensor, a temperature sensor, a raindrop or moisture sensor, etc., the amount of energy to be consumed is presumed and a map for synthetically precognizing the consumption of the energy on the basis of vehicle running data [table containing average vehicle speed and energy (excluding that consumed by the electrical equipments) consumed to drive or run the vehicle] of the past, stored in a table, is prepared. In addition, such determination can be made more accurately by using, as determining or judging conditions, a table in which vehicle speed data, etc. selected according to a driver's preference have been stored.

Figure 7:
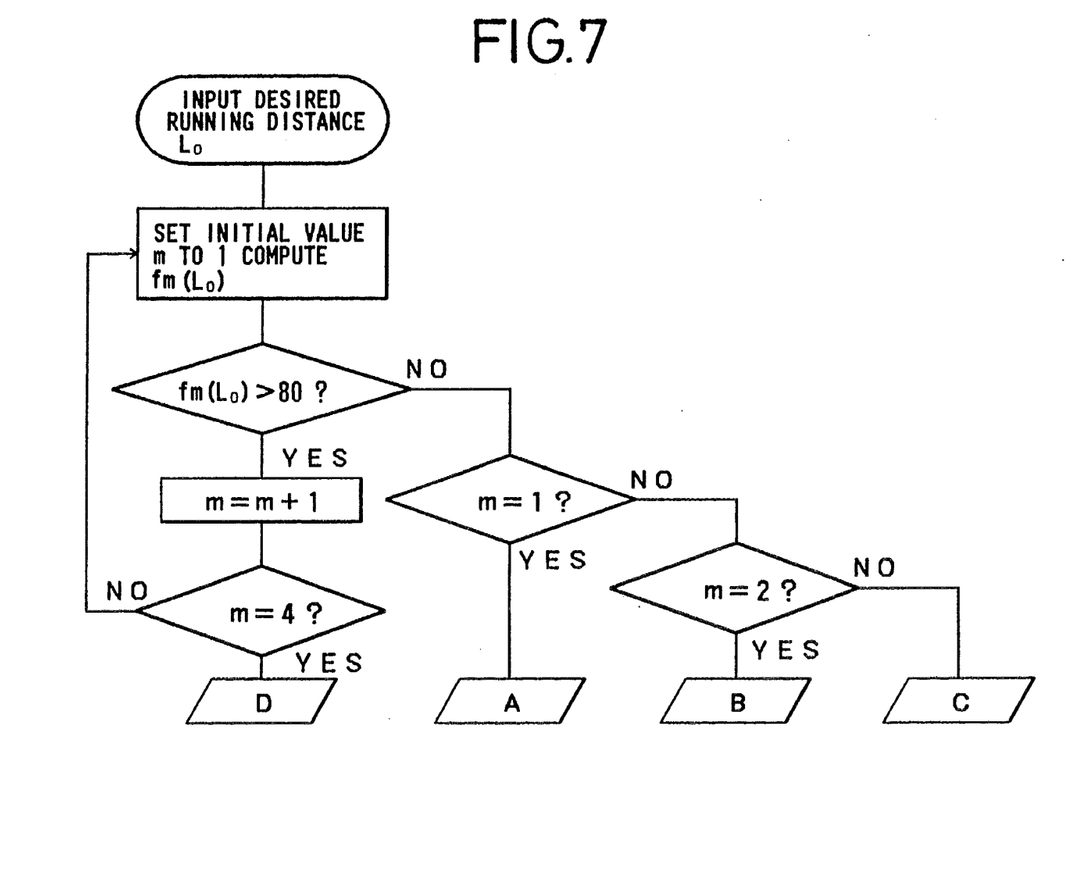
FIG. 7 is a flowchart for describing a running-condition determining and computing subroutine in FIG. 3.

As shown in FIG. 5, a function $f_1(L)$ of the map for precognizing the consumption of the energy represents a curve obtained by driving the vehicle without any restriction of each electrical load when the depth of discharge of the battery is Y. A function $f_2(L)$ represents a curve obtained by driving the vehicle under the restriction of each electrical load when the depth of discharge of the battery is Y. In addition, a function $f_3(L)$ represents a curve obtained by running the vehicle under the restriction of each electrical load when the battery has been fully charged. These functions $f_1(L)$, $f_2(L)$ and $f_3(L)$ can be represented by the following equations:

$$f_1(L) = Y + \frac{E\alpha(L) + Ep(L)}{E_B} \times 100 \quad (1)$$

$$f_2(L) = Y + \frac{\{E\alpha(L) + Ep(L)\} - \{P_6 \times L/V\}}{E_B} \times 100$$

$$f_3(L) = \frac{\{E\alpha(L) + Ep(L)\} - \{P_6 \times L/V\}}{E_B} \times 100$$

where $E_B$:energy of fully-charged battery $E\alpha(L)$:cumulative running consumption energy to distance L $E_p(L)$:cumulative load consumption energy to distance L $P_6 \times L/V$:savable energy to distance L under the restriction of electrical load It is determined from the energy consumption predictive map based on the above expression (1) whether any one of the functions represents the desired running distance (Lo) or shorter and a distance near the desired running distance (Lo) when the expected or desired running distance (Lo) is regarded as an argument and the depth of discharge of the battery is 80%. That is, a function fm(Lo) is computed based on a flowchart shown in FIG. 7 provided that the initial value m is 1, thereby determining a corresponding zone based on the result of its computation. As shown in FIG. 7, if fm (Lo)>80 and the value m equals 4, then the zone D is selected. If fm (Lo) is less than or equal to 80 and the value m equals 1, then the zone A is selected. If m (Lo) is greater than or equal to 80 and the value m is 2, then the zone B is selected but if the value m is not 2, then the zone C is selected.

Figure 3A:
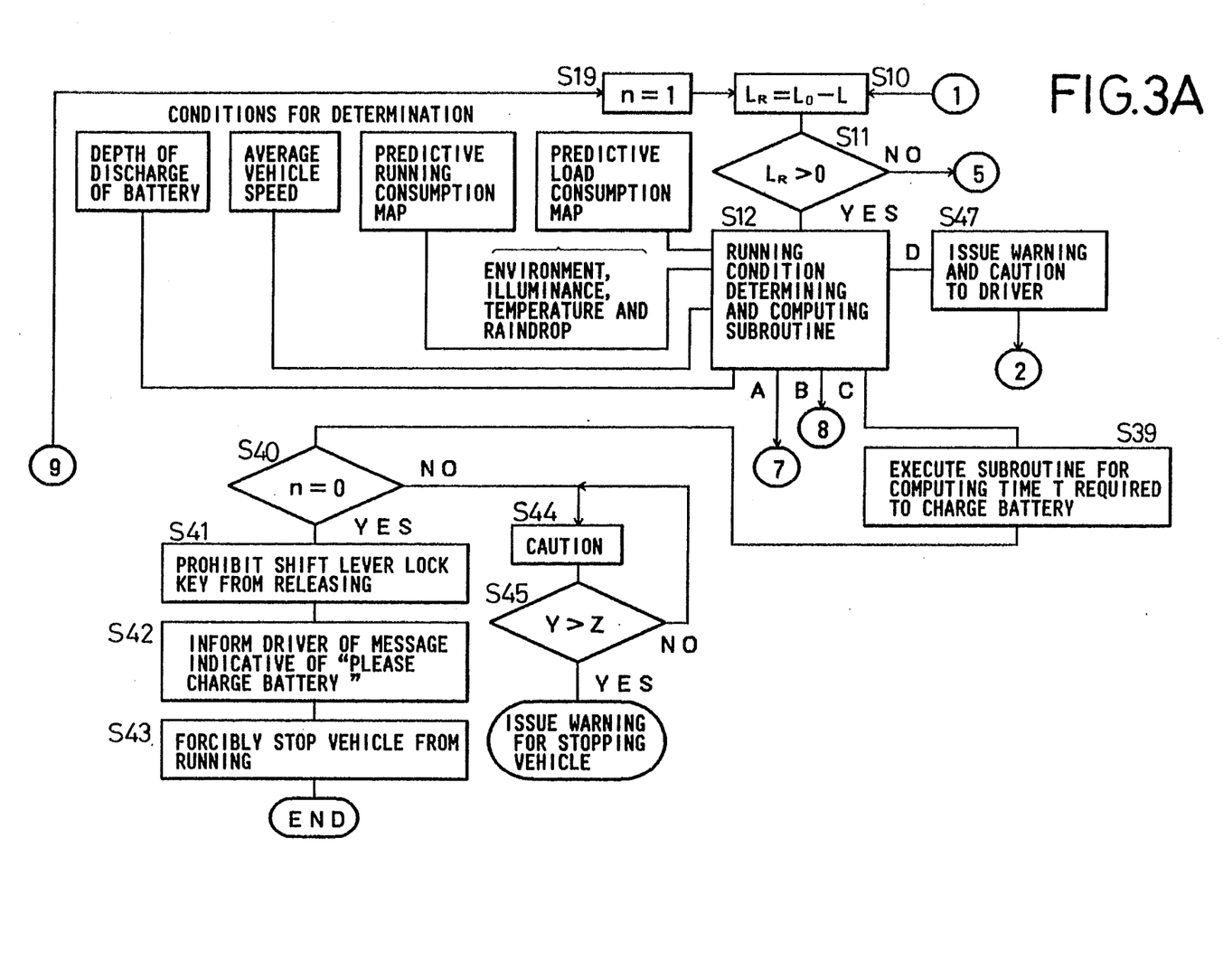
FIG. 3A and 3B are other flowcharts for controlling the electrical load limiting apparatus shown in FIG. 1.
Figure 3B:
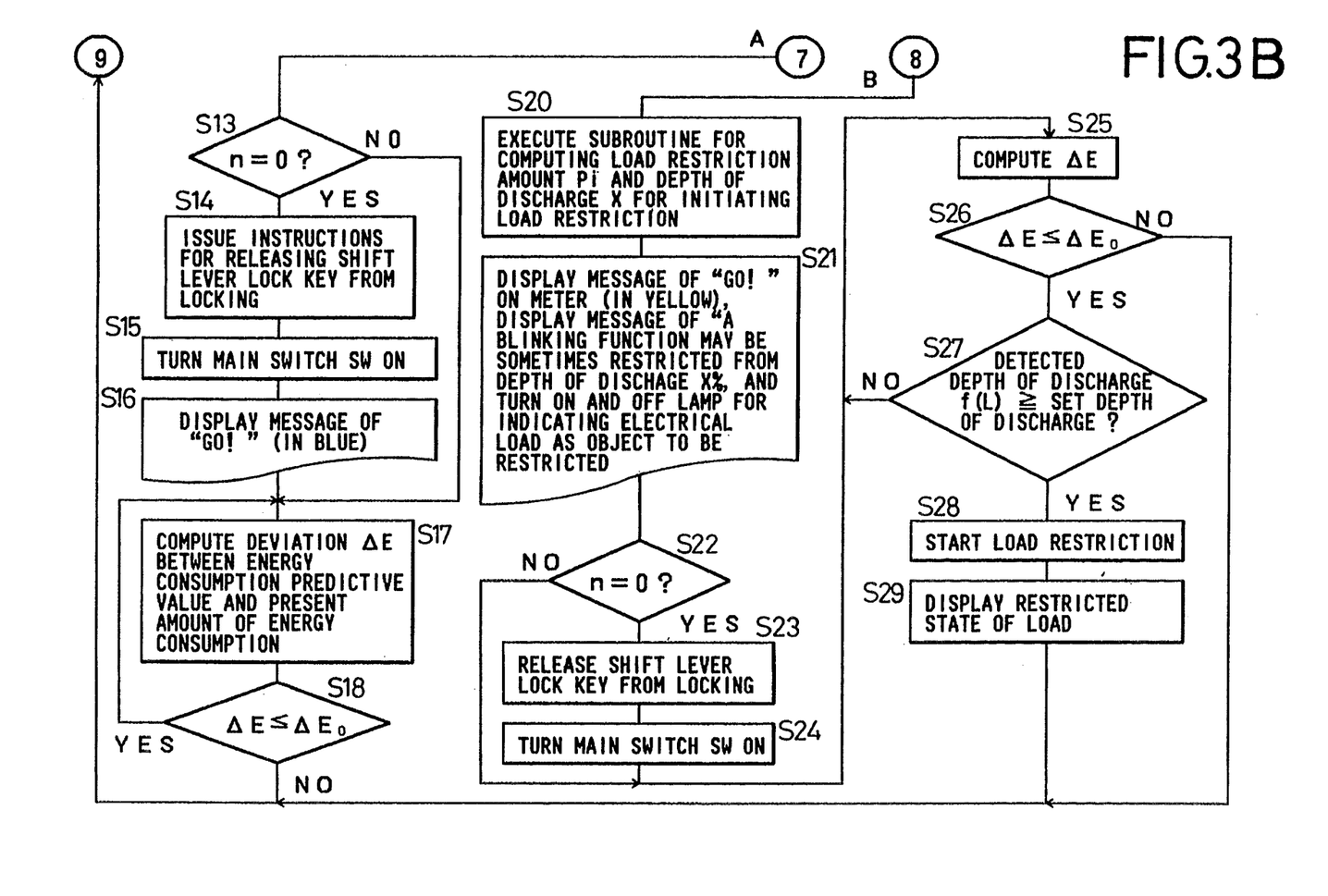

If the zone A is selected in Step S12 in the subroutine of FIG. 7, it is then determined in Step S13 in FIG. 3B (through Figure connecting symbol 7 in FIGS. 3A and 3B) whether or not n is equal to 0 (i.e., n=0). If the answer is determined to be Yes (i.e., n=0), then instructions for releasing the shift lever lock key from locking are issued in Step S14. Further, a main switch is turned ON in Step S15 and a message of "GO!" is displayed on a panel in blue (Step S16). When the message of "GO!" is displayed, the driver presses the accelerator to drive or run the E vehicle. Under the driven state of the E vehicle, computation is made as to a deviation ΔE between an energy consumption predictive value and the present amount of energy consumption (Step S17). Then, the deviation ΔE is compared with a prescribed deviation ΔEo (Step S18). If ΔE<ΔEo, then the routine procedure returns to Step S17, where the computation is made again as to the deviation ΔE.

If the answer is determined to be No in Step S13 (i.e., n≠0), that is, when the E vehicle is running, then the routine procedure skips over to Step S17, where the difference or deviation ΔE between the energy consumption predictive value and the present amount of energy consumption is computed.

If the result of comparison between the deviation ΔE and the prescribed deviation ΔEo is not represented as ΔE<ΔEo, then the routine procedure proceeds to Step S19, where the flag n is set to 1 (through Figure connecting symbol 9 in FIGS. 3A and 3B). Afterwards, the routine procedure is returned to Step S10.

In Step S10, an actual running distance (L) is subtracted from the inputted desired running distance (Lo) to produce a value of the running distance remaining $L_R$. It is determined in Step S11 whether or not the actual running distance (L) has reached the inputted desired running distance (Lo) by whether $L_R > 0$. It should be noted that at the start of a trip $L_R = L_0$ because actual running distance $L = 0$.

If $L_R > 0$ in Step S11, i.e., when the actual running distance (L) has not reached the desired running distance (Lo), a battery depth-of-discharge, an energy consumption predictive map, a predictive energy consumption map of a desired electrical component and an average vehicle speed are newly read in Step S12 to thereby determine a desired running condition again based on the so-read result.

Assuming that a zone determined by the inputted remaining desired running distance ($L_R$) and the depth of discharge f(L) now falls under the zone B shown in FIG. 5, a load restriction amount $P_i$ and a depth of discharge X for initiating the restriction of the electrical load are computed in Step S20 shown in FIG. 3 (see Figure connecting symbol 8 in FIGS. 3A and 3B). Then, a message of "GO!" is displayed on the panel in yellow in Step S21. Further, a message of "A blinking function may be sometimes restricted from the depth of discharge X%" is displayed and a lamp for indicating an electrical load as an object to be restricted is turned on and off.

It is then determined in Step S22 whether or not n is equal to 0 (i.e., n=0). If the answer is determined to be Yes (i.e., n=0), then instructions for releasing the shift lever lock key from locking are issued in Step S23 and the main switch SW is turned ON in Step S24. Thus, the E vehicle starts to run under the operation of the driver. Then, the routine procedure proceeds to Step S25, where a deviation ΔE between an energy consumption predictive value and the present amount of energy consumption is computed in a manner similar to Step S17. Further, the deviation ΔE and the predetermined deviation ΔEo are compared with each other (Step S26). If ΔE < ΔEo, then a detected depth of discharge f(L) is compared with a set depth of discharge X% (Step S27). If the result of its comparison is represented as f(L)≧X, then the restriction of the electrical load 1 is started (Step S28) and the restricted state of the electrical load 1 is displayed (Step S29), after which the flag n is set to 1 (Step S19).

If the result of comparison in Step S26 is not represented as ΔE < ΔEo, then the flag n indicative of the fact that the E vehicle is running is set to 1 (Step S19).

If the result of comparison in Step S27 is not represented as f(L)≧X, then the routine procedure is returned to Step S25, where the deviation ΔE between the energy consumption predictive value and the present amount of energy consumption is computed.

If, on the other hand, the answer is determined to be No in Step S22 (i.e., n≠0), it is then indicated that the E vehicle has been already driven. Therefore, the routine procedure skips over to Step S25.

Figure 6:
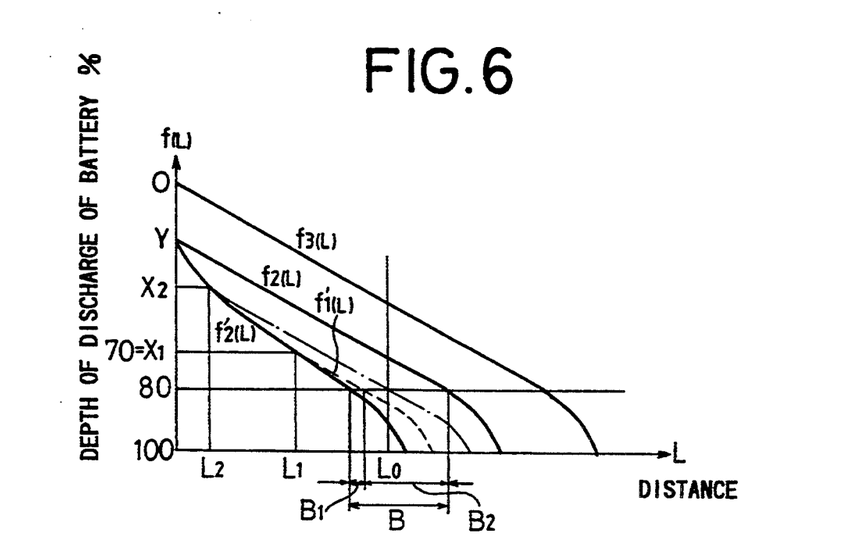
FIG. 6 is an energy consumption precognitive map of the electrical load limiting apparatus of FIG. 1 at the time that an electrical load has been restricted in FIG. 5.

As is apparent from FIG. 6, the zone B can be divided into two zones, i.e., a zone $B_1$ (primary load restriction line) which makes it possible to reach the expected or desired running distance (Lo) by changing a load restriction level from $P_1$ through $P_6$ (see FIG. 8) along the direction to increase the load restriction level from the time of attainment of the depth of discharge f(L) of the battery to 70%, and a zone $B_2$ (secondary load restriction line) which is not allowed to reach the desired running distance (Lo) where the depth of discharge f(L) of the battery has reached 70% even if the load restriction level is fixed to the maximum load restriction level $P_6$. In the case of the zone $B_2$, the battery's depth-of-discharge f(L) for starting the restriction of the electrical load is made in advance of 70% so as to attain the desired running distance (Lo).

Now, an equation for determining the primary load restriction line f'$_1$(L) shown in FIG. 6 can be represented as follows:

$$f_1(L) = Y + \frac{\{E_a(L) + E_p(L)\} - \{P_i \times (L - L_1)/V\}}{E_B} \times 100 \quad (2)$$

where i = 1, 2, 3, 4, 5, 6

$$L_1 = f'_1(X_1)$$

Then, Lo is substituted in the equation (2). If f'$_1$(Lo)≦80, it is then determined to be the zone $B_1$. If f'$_1$(Lo) > 80, it is then determined to be the zone $B_2$. If f'$_1$(Lo) > 80, then the secondary load restriction line f'$_2$(Lo) is determined.

The secondary load restriction line f'$_2$(L) can be represented in the form of the following equation:

When $L \geq L_2$, (3)

$$f_2(L) = Y + \frac{\{E_a(L) + E_p(L)\} - \{P_6 \times (L - L_2)/V\}}{E_B} \times 100$$

Then, Lo is substituted in the above equation (3). If f'$_2$(Lo) is regarded as 80 (i.e., f'$_2$(Lo)=80) $L_2$ can be obtained in accordance with the following equation:

$$L_2 = Lo - \frac{V}{P_6}\left[ E_B \times \frac{Y - 80}{100} + \{E_a(Lo) + E_p(Lo)\} \right] \quad (4)$$

Accordingly, $X_2$ can be determined from $X_2 = f'_1(L_2)$. In this case, $X_2$ represents the battery's depth-of-discharge for initiating the restriction of the electrical load relative to the battery.

Figure 4:
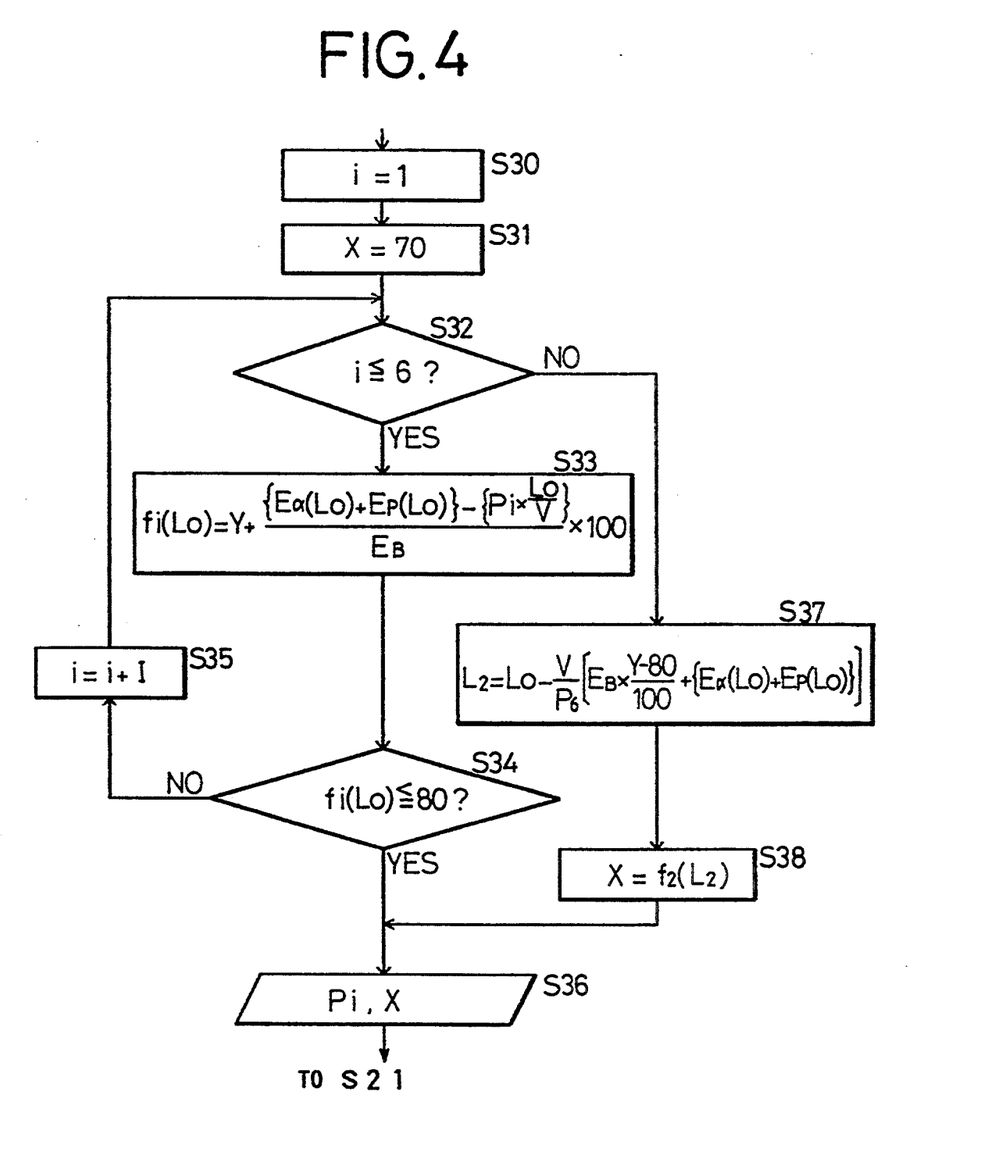
FIG. 4 is a further flowchart for controlling the electrical load limiting apparatus depicted in FIG. 1.

A flowchart for determining these equations, i.e., a subroutine to be executed in Step S20 is illustrated in FIG. 4. More specifically, i is set to 1 in Step S30, and the depth of discharge X is set to 70 in Step S31. It is then determined in Step S32 whether or not i is less than or equal to 6. If the answer is determined to be Yes, then the above equation (2) is calculated in Step S33. If the primary load restriction line f'$_1$(Lo) is more than 80 in Step S34 (i.e. answer is NO), then 1 is added to i in Step S35 and the routine procedure is returned to Step S32. If the answer is determined to be YES in Step S34, then the load restriction amount $P_i$ and the depth of discharge X for initiating the load restriction are output in Step S36. If the answer is determined to be No in Step S32, then the above equation (4) is calculated in Step S37. Then, X is determined in Step S38 and the load restriction amount $P_i$ and the depth of discharge X for initiating the load restriction are output in Step S36. Afterwards, the routine procedure is returned to Step S21. Incidentally, the restriction of each electrical load is carried out by supplying data indicative of the load restriction amount $P_i$ and the depth of discharge X to the load control device 6 shown in FIG. 1.

Figure 10:
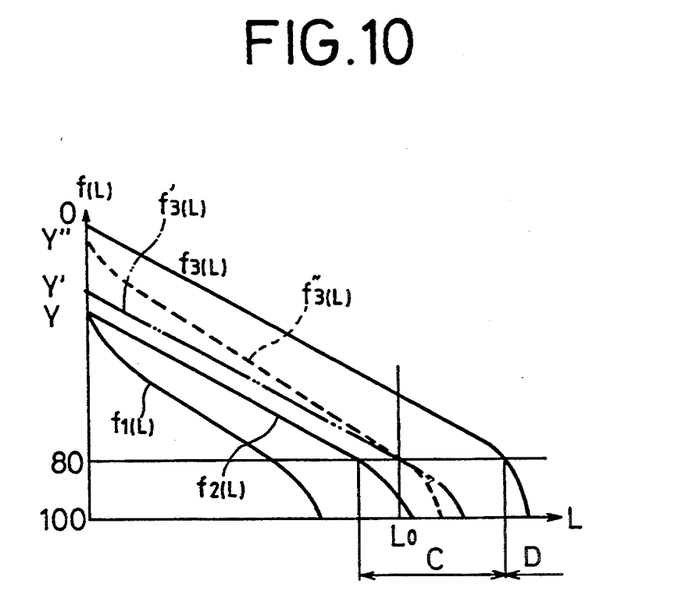
FIG. 10 is an energy consumption precognitive map of the electrical load limiting apparatus shown in FIG. 1.

When the zone C shown in FIG. 5 is selected in Step S12, the E vehicle cannot cover the desired running distance (Lo) set by the driver unless the battery is charged. Therefore, the time required to charge the battery is calculated in Step S39. When it is desired to charge the battery, a choice can be freely made as to whether the battery should be charged up to the energy level required to run or drive the E vehicle, charged to a full level or charged to the level between the energy level required to run it and the full level. When the desired running distance (Lo) falls under the zone C as illustrated in FIG. 10 by way of example, the restriction of the electrical load may be carried out. Therefore, the battery may simply be charged up to a depth of discharge Y' when it is desired to charge the battery by the minimum energy required to attain the desired running distance (Lo). In order to enable the E vehicle to be run over the desired running distance (Lo) even when the restriction of the electrical load is not performed, the battery may be charged up to a depth of discharge Y'''. The above Y' and Y'' and the time intervals required to charge the battery up to Y' and Y'' are now determined. First of all, the depth of discharge Y' and the time interval required to charge the battery up to Y' can be represented in the form of the following equations:

$$80 = f_3(Lo) \qquad (5)$$
$$= Y' + \frac{\{Ea(Lo) + Ep(Lo)\} - \{P_6 \times (Lo/V)\}}{E_B} \times 100$$
$$\therefore Y' = 80 - \frac{\{Ea(Lo) + Ep(Lo)\} - \{P_6 \times (Lo/V)\}}{E_B} \times 100$$

Thus, the time interval required to charge the battery can be expressed as follows:

$$T = \left\{ \frac{Y - Y'}{100} \times E_6 \right\} \div K$$

where K = charging power

Next, the depth of discharge Y'' and the time interval required to charge the battery up to Y'' can be represented in the form of the following equations:

$$80 = f'_3(Lo) = Y'' + \frac{\{Ea(Lo) + Ep(Lo)\}}{E_B} \times 100 \qquad (6)$$
$$\therefore Y'' = 80 - \frac{Ea(Lo) + Ep(Lo)}{E_B} \times 100$$

Thus, the time interval required to charge the battery can be represented as follows:

$$T = \left\{ \frac{Y - Y''}{100} \times E_6 \right\} \div K$$

It is then determined in Step S40 whether or not n is equal to 0. If the answer is determined to be Yes (i.e., n=0), then the E vehicle is not in a driven state. Therefore, the release of the shift lever lock key from locking is prohibited in Step S41. In Step S42, the driver is then informed of a message indicative of "Please charge the battery" by lighting a lamp. Afterwards, a process for forcibly stopping the E vehicle from running is executed in Step S43 so as to complete the routine procedure.

If it is determined in Step S40 that n is equal to 1, then the E vehicle is running. Therefore, the routine procedure proceeds to Step S44, where a message indicative of "Please stop at the nearest charging station because the residual capacity of the battery is low" and the like are issued to the driver. If the depth of discharge Y of the battery is determined to be less than a prescribed value Z in Step S45, then the routine procedure is returned to Step S44, where the message indicative of "Please stop at the nearest charging station because the residual capacity of the battery is low" and the like are continuously given to the driver. If the depth of discharge Y exceeds the prescribed value Z in Step S45, a warning used to call to the driver in such a manner as to stop the engine is issued again.

If the desired running distance (Lo) falls under the zone D shown in FIG. 5, then the E vehicle cannot cover the desired running distance (Lo) even if the battery has been brought to a fully-charged state. Therefore, a warning is given to the driver in Step S47 (FIG. 3A), and the routine procedure is returned to Step S8 (FIG. 2, through Figure connecting symbol 2), where instructions for inputting the suitable desired running distance (Lo) are carried out to properly correct the desired running distance (Lo) (Step S8). When the desired running distance (Lo) falls under the zone D shown in FIG. 5, it is contemplated that a distance longer than the maximum running distance of the E vehicle is inputted and the maximum running distance is reduced due to deterioration in the battery. Accordingly, the routine procedure is returned to Step S8 to correct the desired running distance (Lo).

When, on the other hand, the E vehicle is driven without the desired running distance (Lo) being inputted, it is determined in Step S48 (FIG. 9, through Figure connecting symbol 3 from Step S9 in FIG. 2) whether or not n is equal to 0 (i.e., n=0). If the answer is determined to be Yes (i.e., n=0), it is then determined in Step S49 whether or not a shift lock releasing button has been pressed. If the answer is determined to be Yes, then the main switch SW is turned ON in Step S50. It is thereafter determined in Step S51 whether or not the depth of discharge f(L) of the battery is more than or equal to 70%. If the answer is determined to be Yes, then the routine procedure proceeds to Step S52.

Figure 9:
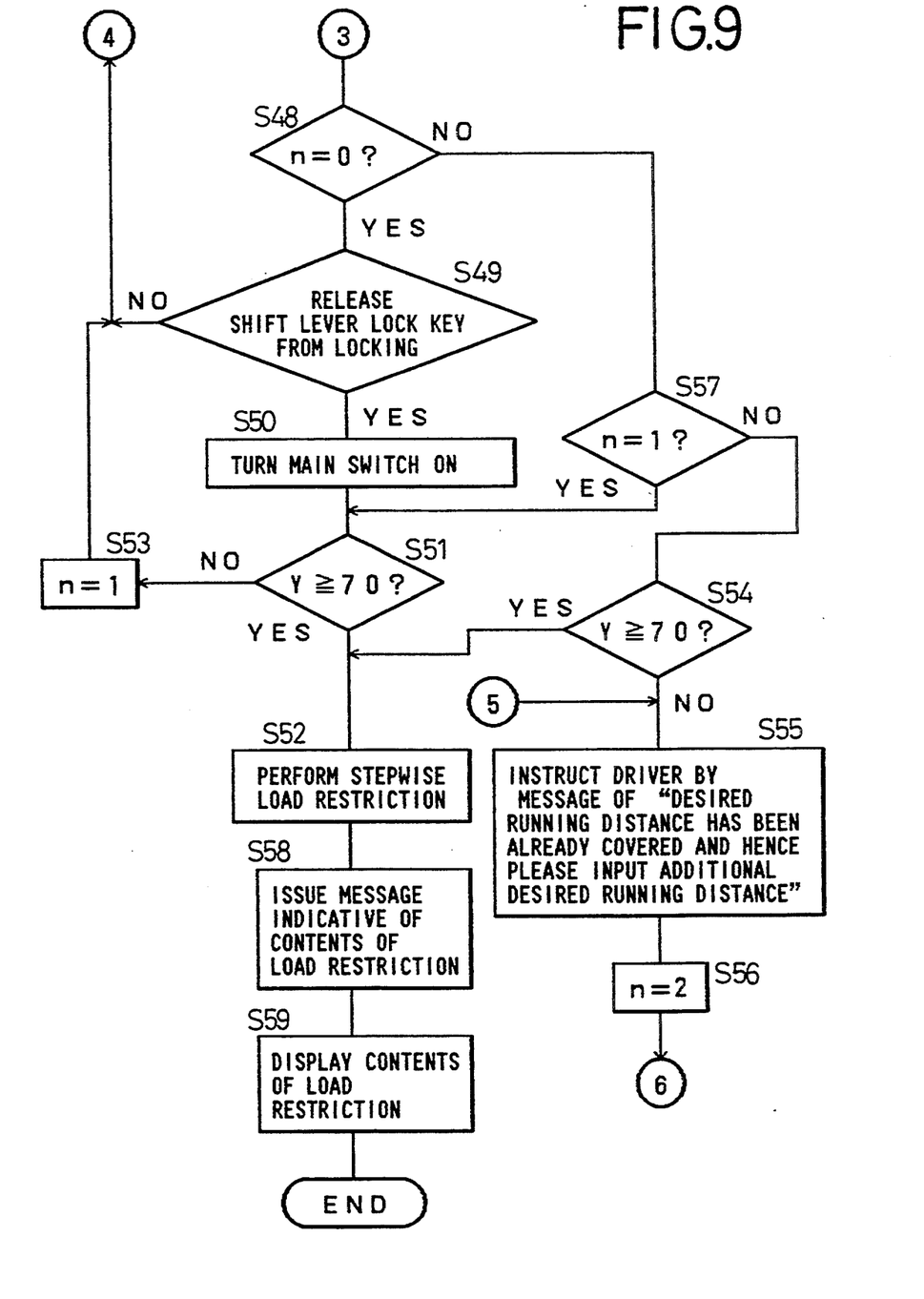
FIG. 9 is a flowchart for describing a subroutine relative to the amount $P_i$ of restriction of an electrical load and a depth of discharge X for initiating the restriction of the electrical load.

If the answer in Step S51 is determined to be No, then the routine procedure proceeds to Step S53, where n is set to 1. Thereafter, the routine procedure is returned to Step S8 (in FIG. 2, through Figure connecting symbol 4).

Even when the shift lock releasing button is not pressed in Step S49, the routine procedure is returned to Step S8 in the same manner as described above, where a new desired running distance (Lo) is placed in an input waiting state.

Steps S52, S57 and S54 will be described later. A description will now be made to a case in which the E vehicle has covered the desired running distance (Lo).

If the desired running distance remaining (L_R) is less than 0 in Step S11, then the driver is informed, in Step S55 (FIG. 9, through Figure connecting symbol 5), of the fact that the E vehicle has covered only the original desired running distance (Lo), and instructions are given to the driver so as to input the possible new remaining running distance. At this time, n is set to 2 in Step S56. Then, a new desired running distance (Lo) to be inputted by the driver is placed in a waiting state in Step S9.

If the answer is determined to be No (i.e., n≠0) in Step S48, it is then determined in Step S57 whether n is equal to 1 or 2, i.e., the desired running distance (Lo)

has been cleared while the E vehicle is running. If it is determined that n is equal to 1, that is, the desired running distance (Lo) has not been cleared, then the routine procedure proceeds to Step S51. If the depth of discharge Y is less than or equal to 70% in Step S51, then the routine procedure proceeds to Step S53, where n is set to 1. Then, the routine procedure is returned to Step S8. If the depth of discharge Y is more than or equal to 70%, then the routine procedure proceeds to Step S52, where the electrical load is restricted based on prescribed stepwise restriction rules. A message indicative of the contents of load restriction is issued in Step S58. Further, the contents of the load restriction are displayed in Step S59, after which the routine procedure is completed.

When n is equal to 2 in Step S57, i.e., when the vehicle continues running even after the desired running distance (Lo) has been cleared, the routine procedure proceeds to Step S54. If the depth of discharge Y is less than or equal to 70% in Step S54 (i.e. a NO answer), then a message indicative of "The desired running distance has been already covered and hence please input an additional desired running distance" and the like are issued in Step S55. Then, n is set to 2 (Step S56) and the routine procedure is returned to Step S9, where a new desired running distance to be inputted by the driver is placed in a waiting state.

If the depth of discharge f(L) is more than or equal to 70% in Step S54, then the processes subsequent to Step S52 are executed in the same manner as when $Y \geq 70$ in Step S51.

A plurality of maps are assigned as data to a memory for every driver. In this condition, data about a feature of a driver's manner of driving and data about a function for discriminating a driver while running at present are stored in that memory. By so doing, the consuming energy can be predicted more accurately according to the driver.

According to the present invention, as has been described above, an electrical load is restricted according to a vehicle running condition. Thus, when a desired running distance is inputted at the start of the vehicle, it can be determined accurately according to use environments whether or not the vehicle can cover the inputted desired running distance. When the vehicle cannot cover the desired running distance, suitable instructions (such as need for charging) can be given to the driver in advance. Further, since the amount of restriction of each electrical load can be controlled according to the desired running distance and the use environments of the vehicle, the degree of freedom of control on the load restriction is great and the electrical load is no longer restricted excessively. Furthermore, the difference between an estimated amount of energy consumption and an actual amount of energy consumption is fed back as data and monitored at all times. It is therefore possible to accurately limit each electrical load.

Having now fully described the invention, it will be apparent to those skilled in the art that many changes and modifications can be made without departing from the spirit or scope of the invention as set forth herein.

What is claimed is:

1. A method of limiting selected electrical loads on a battery of an electric vehicle, other than an electrical load of a vehicle-driving motor, depending on a desired vehicle running distance selected by a vehicle operator upon commencement of an operation of the electrical vehicle, comprising steps of:

inputting the desired vehicle running distance by desired running distance inputting means:

detecting a depth of discharge of the battery by battery condition detecting means:

detecting ambient environment data at the electrical vehicle including at least one ambient light brightness, ambient temperature, ambient moisture and ambient wind velocity;

determining a vehicle running conditions based on said desired vehicle running distance, said depth of discharge and said ambient enviromnent data; and selectively controlling each of the selected electrical loads on the battery in a predetermined manner, including at least one of (a) preventing said selected electrical load from being turned on, (b) turning off said selected electrical load, and (c) restricting a magnitude of operation of said selected electrical load, by electrical load limiting means based on said determination of said vehicle running condition for controlling the rate of discharge of the battery by said selected electrical loads for running the electric vehicle for said desired vehicle running distance.

2. A method according to claim 1, wherein said electrical load control is carried out according to only said depth of discharge when the electric vehicle is operated without said desired vehicle running distance being inputted by said desired running distance inputting means at the time of commencement of operation of the electric vehicle.

3. A method according to claim 1, wherein said electrical load control is stepwise performed by said electrical load limiting means to control the operation of said selected electrical loads in successive steps in accordance with said depth of discharge.

4. A method according to claim 1, wherein said electrical load control includes a step of issuing charging instructions when said desired vehicle running distance cannot be attained because of the magnitude of said detected depth of discharge of the battery even if the selected electrical loads are stepwise controlled by said electrical load limiting means in accordance with said depth of discharge.

5. A method according to claim 1, wherein said electrical load control includes a step of issuing instructions for correcting said desired vehicle running distance when said desired running distance cannot be attained because of the magnitude of said detected depth of discharge of the battery even in the case where the battery has been fully charged and the selected electrical loads are stepwise controlled by said electrical load limiting means in accordance with said depth of discharge.

6. A method according to any of claims 1 to 5, wherein said electrical load control includes a step of issuing instructions to the operator of the electric vehicle depending on the state of control by said electrical load limiting means of the selected electrical loads on the battery.

7. A method according to claim 1, wherein said ambient environment data at the electric vehicle is data output from an illuminance sensor, a temperature sensor and a raindrop sensor.

8. A method according to claim 1, wherein said determination of the vehicle running conditions are performed based at least in part on past vehicle running data.

9. A method of limiting selected electrical loads on a battery of an electric vehicle, other than an electrical load of a vehicle-driving motor, depending on a desired vehicle running distance selected by a vehicle operator upon commencement of an operation of the electrical vehicle, comprising steps of:
  inputting the desired vehicle running distance by desired running distance inputting means;
  detecting a depth of discharge of the battery by battery condition detecting means;
  detecting ambient environment data at the electrical vehicle including at least one of ambient light brightness, ambient temperature, ambient moisture and ambient wind velocity;
  determining a vehicle running condition based on said desired vehicle running distance, said depth of discharge and said ambient environment data; and
  selectively controlling each of the selected electrical loads on the battery in a predetermined manner, including at least one of (a) preventing said selected electrical load from being turned on, (b) turning off said selected electrical load, and (c) restricting a magnitude of operation of said selected electrical load, by electrical load limiting means based on said determination of said vehicle running condition for controlling the rate of discharge of the battery by said selected electrical loads for running the electric vehicle for said desired vehicle running distance;
  wherein said determination of the vehicle running conditions are performed using a look-up map for predicting the consumption of energy.

10. A method according to claim 9, wherein said look-up map is provided with a vehicle drivable distance divided into a plurality of distance zones, and said determination of the running conditions are carried out using said look-up map.

11. A method according to claim 10, wherein said plurality of distance zones in said look-up map are represented in the form of the following distance zones:
  A: a distance zone to which it is possible to reach without restricting electrical loads connected to the battery;
  B: a distance zone to which it is possible to reach by restricting electrical loads connected to the battery;
  C: a distance zone to which it is impossible to reach unless the battery is charged; and
  D: a distance zone to which it is impossible to reach even if the battery is fully charged.

12. A method according to claim 10, wherein the representation of said plurality of distance zones in the form of the four distance zones is made on the basis of said depth of discharge being 80% discharged.

13. An apparatus for limiting electrical loads due to selected electrical equipment mounted on an electric vehicle depending on a desired vehicle running distance selected by a vehicle operator upon commencement of an operation of an electric vehicle, comprising:
  running means for driving the electric vehicle;
  a battery for driving said running means and operating the selected electrical equipment;
  battery condition detecting means for detecting a depth of discharge of said battery;
  desired vehicle running distance inputting means tier inputting the desired vehicle running distance;
  means for detecting ambient environment data at the electric vehicle including at least one of ambient light brightness, ambient temperature, ambient moisture and ambient wind velocity;
  means supplied with said depth of discharge detected by said battery condition detecting means, the desired vehicle running distance inputted by said desired vehicle running distance inputting means and the ambient environment data at said electric vehicle for determining a vehicle running condition; and
  electrical load controlling means for controlling the selected electrical loads on said battery in a predetermined manner, including at least one of (a) preventing said selected electrical load from being turned on, (b) turning off said selected electrical load, and (c) restricting a magnitude of operation of said selected electrical load, based on said determination of said vehicle running condition.

14. An apparatus according to claim 13, wherein said means for determining said vehicle running conditions comprises depth-of-discharge means for determining the remaining capacity of said battery and means for determining desired vehicle running conditions from said desired vehicle running distance inputted by said desired vehicle running distance inputting means.

15. An apparatus for limiting electrical loads due to selected electrical equipment mounted on an electric vehicle depending on a desired vehicle running distance selected by a vehicle operator upon commencement of an operation of the electric vehicle, comprising:
  running means for driving the electric vehicle;
  a battery for driving said running means and operating the selected electrical equipment;
  battery condition detecting means for detecting a depth of discharge of said battery;
  desired vehicle running distance inputting means for inputting the desired vehicle running distance;
  means for detecting ambient environment data at the electric vehicle including at least one of ambient light brightness, ambient temperature, ambient moisture and ambient wind velocity;
  means supplied with said depth of discharge detected by said battery condition detecting means, the desired vehicle running distance inputted by said desired vehicle running distance inputting means and the ambient environment data at said electric vehicle for determining a vehicle running condition; and
  electrical load controlling means for controlling the selected electrical loads on said battery in a predetermined manner, including at least one of (a) preventing said selected electrical load from being turned on, (b) turning off said selected electrical load, and (c) restricting a magnitude of operation of said selected electrical load, based on said determination of said vehicle running condition;
  wherein said means for determining said vehicle running conditions includes a look-up map for predicting the consumption of energy, said look-up map being divided into the following four distance zones:
  A: a distance zone to which it is possible to reach without limiting electrical loads connected to the battery;
  B: a distance zone to which it is possible to reach by limiting electrical loads connected to the battery;
  C: a distance zone to which it is impossible to reach unless the battery is charged; and
  D: a distance zone to which it is impossible to reach even if the battery is fully charged.

* * * * *